United States Patent
Osanai et al.

(10) Patent No.: US 8,760,926 B2
(45) Date of Patent: Jun. 24, 2014

(54) MEMORY CIRCUIT

(75) Inventors: Jun Osanai, Chiba (JP); Yoshitsugu Hirose, Chiba (JP); Kazuhiro Tsumura, Chiba (JP); Ayako Inoue, Chiba (JP)

(73) Assignee: Seiko Instruments Inc. (JP)

( * ) Notice: Subject to any disclaimer, the term of this patent is extended or adjusted under 35 U.S.C. 154(b) by 168 days.

(21) Appl. No.: 13/534,132

(22) Filed: Jun. 27, 2012

(65) Prior Publication Data

US 2013/0016563 A1    Jan. 17, 2013

(30) Foreign Application Priority Data

Jul. 14, 2011  (JP) ................................. 2011-155701

(51) Int. Cl.
*G11C 16/04*      (2006.01)
(52) U.S. Cl.
USPC ...................................................... 365/185.18
(58) Field of Classification Search
None
See application file for complete search history.

(56) References Cited

U.S. PATENT DOCUMENTS

2004/0080982 A1*   4/2004   Roizin ..................... 365/185.28

FOREIGN PATENT DOCUMENTS

JP           04079271           3/1992

* cited by examiner

*Primary Examiner* — Huan Hoang
*Assistant Examiner* — James G Norman
(74) *Attorney, Agent, or Firm* — Adams & Wilks

(57) ABSTRACT

Provided is a memory circuit in which erroneous writing is less likely to occur at the time of power-on. A memory circuit (10) includes: a P-channel non-volatile memory element (15) for writing, to which a voltage is applied between a source and a drain thereof only during writing so as to write data; and an N-channel non-volatile memory element (16) for reading, which has a control gate and a floating gate provided in common to a control gate and a floating gate of the P-channel non-volatile memory element (15) and to which a voltage is applied to a source and a drain thereof only during reading so as to read the data.

8 Claims, 9 Drawing Sheets

N-channel non-volatile memory element

P-channel non-volatile memory element

N-channel non-volatile memory element

P-channel non-volatile memory element

N-channel non-volatile memory element

P-channel non-volatile memory element

US 8,760,926 B2

MEMORY CIRCUIT

BACKGROUND OF THE INVENTION

1. Field of the Invention

The present invention relates to a memory circuit for writing and reading data with the use of a non-volatile memory element.

2. Description of the Related Art

A conventional memory circuit is described with reference to FIG. 9. FIG. 9 is a schematic diagram of a memory cell structure in which a memory element for writing and a memory element for reading share a single floating gate.

In writing operation, a transistor Q1 is controlled to turn OFF and a transistor Q2 is controlled to turn ON. A write control circuit 92 applies a voltage between a source and a drain of an N-channel non-volatile memory element Q4 to inject electrons into a floating gate, thereby writing apiece of data in the non-volatile memory element Q4. N-channel non-volatile memory elements Q3 and Q4 are arranged to share a control gate indicated by a solid line and a floating gate indicated by a broken line. Thus, when the piece of data is written in the non-volatile memory element Q4, the data is also written in the non-volatile memory element Q3.

In reading operation, the transistor Q1 is controlled to turn ON and the transistor Q2 is controlled to turn OFF. A sense amplifier 91 applies a voltage between a source and a drain of the non-volatile memory element Q3 to detect whether the non-volatile memory element Q3 turns ON or not, and sends the result of detection as an output (see, for example, Japanese Published Patent Application No. H 04-079271).

SUMMARY OF THE INVENTION

In the conventional technology described above, however, at the time of power-on, if the transistor Q2 turns ON to apply a voltage between the source and the drain of the non-volatile memory element Q4 and the voltage of the control gate CG is not fixed, the memory element Q4 having no data written thereon may be applied with an unintended voltage for writing a data. Specifically, when such a voltage is applied, a current easily flows through a channel of the memory element Q4 which is originally a depletion type, and channel hot electrons generated in the channel are injected into the floating gate, with the result that the memory element Q4 gradually changes to an enhancement type, that is, so-called erroneous writing occurs in the memory element Q4 causing a reliability problem.

The present invention has been made in view of the above-mentioned problem, and provides a memory circuit in which erroneous writing is less likely to occur at the time of power-on.

In order to solve the above-mentioned problem, the present invention provides a memory circuit for writing and reading a data of a non-volatile memory element, the memory circuit including: a P-channel non-volatile memory element for writing, to which a voltage is applied between a source and a drain thereof only during writing operation; and an N-channel non-volatile memory element for reading, which has a control gate and a floating gate provided in common to a control gate and a floating gate of the P-channel non-volatile memory element and to which a voltage is applied between a source and a drain thereof only during reading operation.

According to the memory circuit of the present invention, at the time of power-on, even if a power supply voltage is applied to a power supply terminal and a source-drain voltage of the P-channel non-volatile memory element for writing becomes higher and even if a control gate voltage becomes lower than the power supply voltage and the potential of a floating gate electrode is shifted to the negative side so that a channel is formed in the P-channel non-volatile memory element to permit a current flow, drain avalanche hot electrons are not generated unless the drain voltage is sufficient. Therefore, erroneous writing is less likely to occur in the P-channel non-volatile memory element. Thus, the occurrence of erroneous writing can be reduced as compared with the case of using an N-channel non-volatile memory element, and hence the reliability can be enhanced.

Further, in writing operation, a P-channel non-volatile memory element, in which a data is more easily written than in an N-channel non-volatile memory element, is used. Accordingly the power supply voltage during writing operation can be reduced.

DETAILED DESCRIPTION OF THE PREFERRED EMBODIMENT

Hereinafter, an embodiment of the present invention is described with reference to the accompanying drawings.

Figure 1:
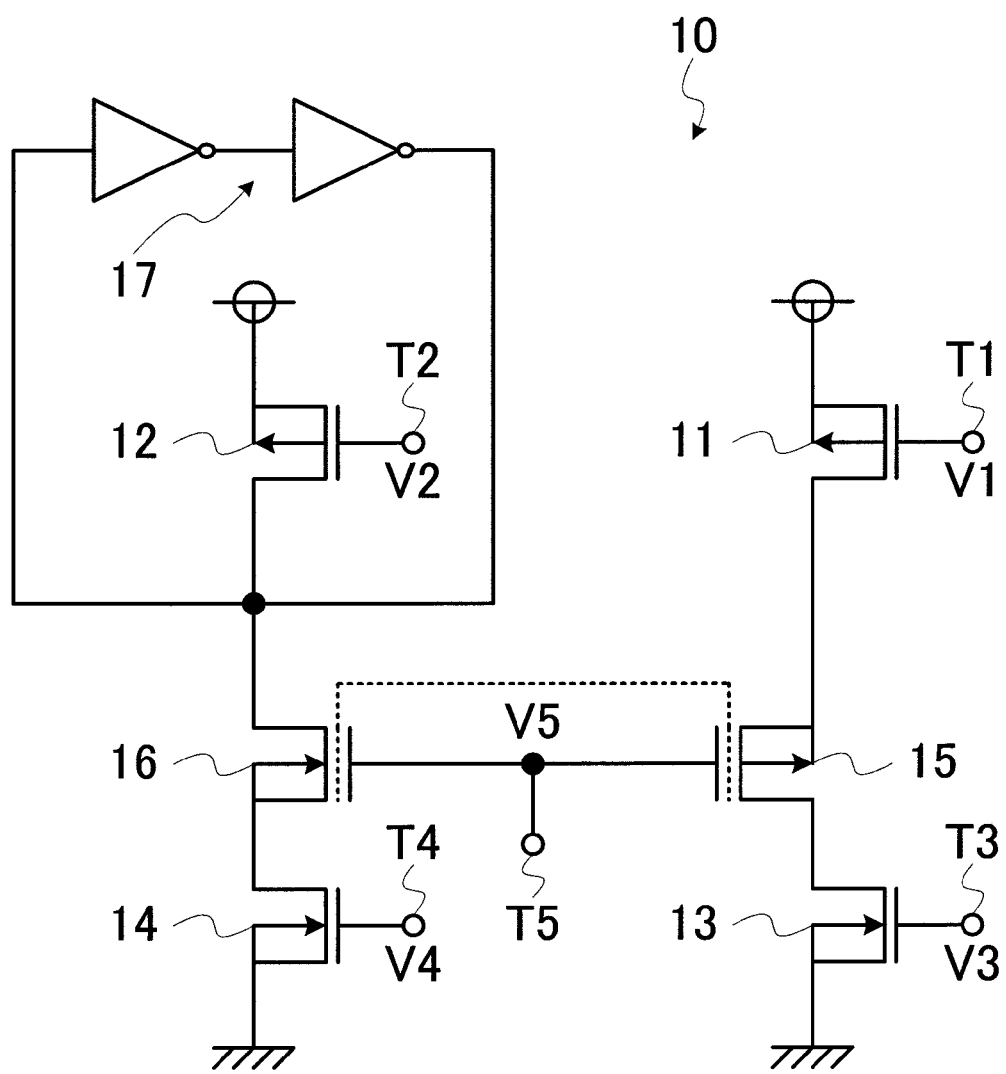
FIG. 1 is a diagram illustrating a memory circuit.
Figure 2:
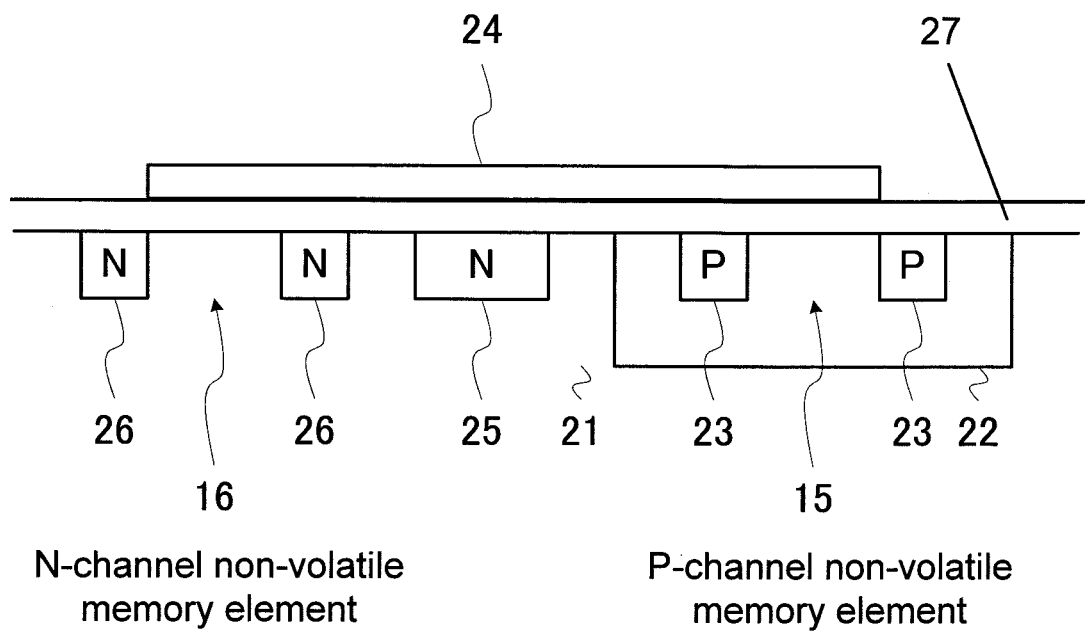
FIG. 2 is a cross-sectional diagram illustrating non-volatile memory elements.

First, a configuration of a memory circuit is described. FIG. 1 is a diagram illustrating the memory circuit. FIG. 2 is a cross-sectional diagram illustrating non-volatile memory elements.

As illustrated in FIG. 1, a memory circuit 10 includes P-channel MOS transistors (hereinafter, referred to as PMOS transistors) 11 and 12, N-channel MOS transistors (hereinafter, referred to as NMOS transistors) 13 and 14, a P-channel non-volatile memory element 15, an N-channel non-volatile memory element 16, and a latch 17. The memory circuit 10 further includes terminals T1 to T5.

The PMOS transistor 11 has a gate connected to the terminal T1, and a source and a back gate connected to a power supply terminal. The NMOS transistor 13 has a gate connected to the terminal T3, and a source and a back gate connected to a ground terminal. The P-channel non-volatile memory element 15 has a control gate connected to the terminal T5, a source and a drain connected to a drain of the PMOS transistor 11, and a drain connected to a drain of the NMOS transistor 13.

The PMOS transistor 12 has a gate connected to the terminal T2, and a source and a back gate connected to the power supply terminal. The NMOS transistor 14 has a gate connected to the terminal T4, and a source and a back gate connected to the ground terminal. The N-channel non-volatile memory element 16 has a control gate connected to the terminal T5, a floating gate connected to a floating gate of the P-channel non-volatile memory element 15, a source and a drain connected to a drain of the NMOS transistor 14, and a drain connected to a drain of the PMOS transistor 12 and to input and output terminals of the latch 17.

Next, the structure of the non-volatile memory elements is described. FIG. 2 is a cross-sectional diagram illustrating the non-volatile memory elements. As illustrated in FIG. 2, in the P-channel non-volatile memory element 15 and the N-channel non-volatile memory element 16, an N-type well 22 is provided on the surface of a substrate 21. On the surface of the N-type well 22, P-type diffusion layers 23 corresponding to the source and the drain of the P-channel non-volatile memory element 15 are provided. Above a channel region of the P-channel non-volatile memory element 15, a polysilicon film 24 corresponding to the floating gate is provided through the intermediation of a gate insulating film 27. Below the polysilicon film 24, an N-type diffusion layer 25 corresponding to the control gate is provided On the surface of the substrate 21 through the intermediation of the gate insulating film 27. The N-type diffusion layer 25 corresponding to the control gate has a strong capacitive coupling to the floating gate, and the potential of the floating gate can be controlled through the potential of the control gate. Further, below the polysilicon film 24, a channel region of the N-channel non-volatile memory element 16 is provided through the intermediation of the insulating film 27. This channel region is provided on the surface of the substrate 21 between N-type diffusion layers 26 corresponding to the source and the drain of the N-channel non-volatile memory element 16.

Subsequently, the operation of the memory element is described. First, a certain voltage is applied to the control gate such that the floating gate has an intermediate voltage between a power supply voltage and a ground voltage to have a predetermined drain current flowing in the non-volatile memory elements. When a sufficient difference exists between the power supply voltage and the ground voltage, drain avalanche hot electrons are generated in the substrate in the vicinity of the drain. If the memory element is the N-channel non-volatile memory element 16, the floating gate voltage is lower than a drain voltage, and hence the drain avalanche hot electrons are injected mainly into the drain. Since the memory element is, however, the P-channel non-volatile memory element 15, the floating gate voltage is higher than a drain voltage, and hence many drain avalanche hot electrons are injected also into the floating gate. Thus, under the above-mentioned voltage application conditions, writing operation take place more easily in the P-channel non-volatile memory element 15 than in the N-channel non-volatile memory element 16. As long as the magnitude relationship of the applied voltages is held, the writing operation takes place even when the power supply voltage decreases. Accordingly, with the use of the P-channel non-volatile memory element 15, the power supply voltage during writing operation can be lowered.

According to the present invention, the P-channel non-volatile memory element 15 is thus used for writing and a voltage is applied between the source and the drain thereof only during writing operation so as to write a data, and the N-channel non-volatile memory element 16 is used for reading and a voltage is applied between the source and the drain thereof only during reading operation so as to read the data.

Figure 3:
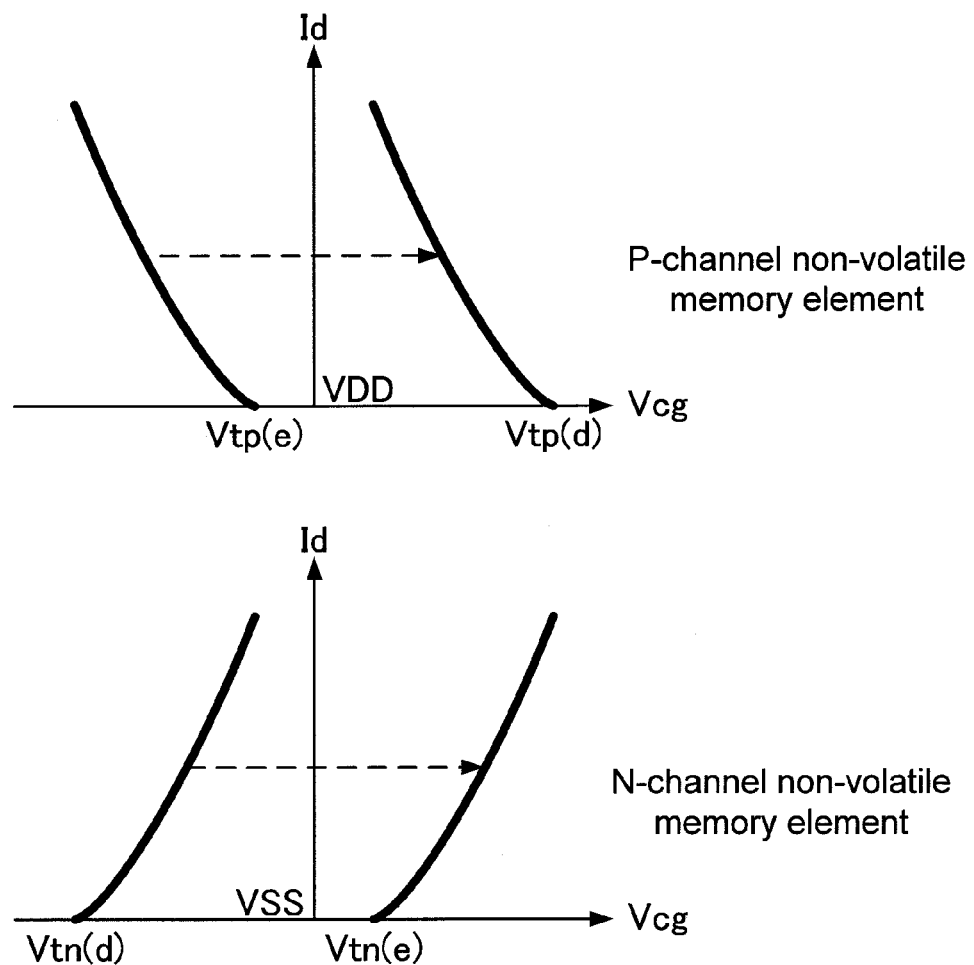
FIG. 3 is graphs showing a change in threshold voltage of the non-volatile memory elements.

Next, the operation of the memory circuit 10 is described. FIG. 3 shows graphs to explain a change in a threshold voltage of the non-volatile memory elements. In the graphs the ordinate is a drain current flowing through one of the memory elements and the abscissa is a control gate voltage measured from the power supply voltage Vdd for a P-channel non-volatile memory element and from the ground voltage Vss for an N-channel non-volatile memory element.

Before writing, the P-channel non-volatile memory element 15 is an enhancement PMOS transistor and has a threshold voltage Vtp(e)<0. After writing, the P-channel non-volatile memory element 15 is a depletion PMOS transistor and has a threshold voltage Vtp(d)>0.

Further, before writing, the N-channel non-volatile memory element 16 is a depletion NMOS transistor and has a threshold voltage Vtn(d)<0. After writing, the N-channel non-volatile memory element 16 is an enhancement NMOS transistor and has a threshold voltage Vtn(e)>0.

Operation During Writing

In this case, a voltage V1 of the terminal T1 is controlled to Low level and the PMOS transistor 11 turns ON. A voltage V3 of the terminal T3 is controlled to High level and the NMOS transistor 13 turns ON. A voltage V2 of the terminal T2 is controlled to High level and the PMOS transistor 12 turns OFF. A voltage V4 of the terminal T4 is controlled to Low level and the NMOS transistor 14 turns OFF. A voltage V5 of the terminal T5 is controlled to a voltage Vtp(e)−α, which is slightly larger in the absolute value than the threshold voltage Vtp(e) of the P-channel non-volatile memory element 15. Accordingly, a drain current easily flows through the P-channel non-volatile memory element 15.

When the power supply voltage is applied to the power supply terminal, the source-drain voltage of the P-channel non-volatile memory element 15 for writing becomes higher, and a drain current flows through the P-channel non-volatile memory element 15. Then, drain avalanche hot electrons are injected into the floating gate that is provided in common to the P-channel non-volatile memory element 15 and the N-channel non-volatile memory element 16. since hot electrons having negative charges are store in the floating gate, as shown in FIG. 3, the threshold voltage of the P-channel non-volatile memory element 15 changes from the threshold voltage Vtp(e) to the threshold voltage Vtp(d). Further, the threshold voltage of the N-channel non-volatile memory element 16 changes from the threshold voltage Vtn(d) to the threshold voltage Vtn(e) In other words, the P-channel non-volatile memory element 15 changes from an enhancement PMOS transistor to a depletion PMOS transistor while the N-channel non-volatile memory element 16 changes from a depletion NMOS transistor to an enhancement NMOS transistor.

In addition, even if the power supply voltage is applied to the power supply terminal, no voltage is applied between the source and the drain of the N-channel non-volatile memory element 16.

Then, after a time period necessary for writing has elapsed, the voltage V1 of the terminal T1 is controlled to High level and the PMOS transistor 11 turns OFF. The voltage V3 of the terminal T3 is controlled to Low level and the NMOS transistor 13 turns OFF.

Operation During Reading at the Time of Power-on

Then, when the power is on, reading is performed. In this case, the voltage V1 of the terminal T1 is controlled to High level and the PMOS transistor 11 turns OFF. The voltage V3 of the terminal T3 is controlled to Low level and the NMOS transistor 13 turns OFF. The voltage V2 of the terminal T2 is controlled to Low level and the PMOS transistor 12 turns ON.

The voltage V4 of the terminal T4 is controlled to High level and the NMOS transistor 14 turns ON. The voltage V5 of the terminal T5 is controlled to the ground voltage.

When the power supply voltage is applied to the power supply terminal, the source-drain voltage of the N-channel non-volatile memory element 16 for reading becomes higher. Since the drain avalanche hot electrons have been injected into the floating gate during writing, the N-channel non-volatile memory element 16 for reading has become an enhancement NMOS transistor. In this case, the N-channel non-volatile memory element 16 is an enhancement NMOS transistor, and the control gate provided in common to the P-channel non-volatile memory element 15 and the N-channel non-volatile memory element 16 has the ground voltage, and hence the N-channel non-volatile memory element 16 turns OFF. Accordingly, the drain of the N-channel non-volatile memory element 16 is pulled up so that the drain voltage becomes High level. This drain voltage at High level (reading result of the N-channel non-volatile memory element 16) is held by the latch 17 and can be read.

In addition, even if the power supply voltage is applied to the power supply terminal, no voltage is applied between the source and the drain of the P-channel non-volatile memory element 15.

Then, after a time period necessary for reading has elapsed and the drain voltage at High level (reading result of the N-channel non-volatile memory element 16) has been reliably held by the latch 17, the voltage V2 of the terminal T2 is controlled to High level and the PMOS transistor 12 turns OFF. The voltage V4 of the terminal T4 is controlled to Low level and the NMOS transistor 14 turns OFF.

Note that, in the case where drain avalanche hot electrons have not been injected into the floating gate during writing, the N-channel non-volatile memory element 16 becomes a depletion NMOS transistor. In this case, the N-channel non-volatile memory element 16 is a depletion NMOS transistor and the control gate has the ground voltage, and hence the N-channel non-volatile memory element 16 turns ON.

The above description is directed to the normal operation performed at the time of power-on. However, the operation is not necessarily normal depending on how to turn on power. In the conventional technology using only an N-channel non-volatile memory element, erroneous writing may occur, which has been a problem. Such a case is described below.

In a normal operation, at the time of power-on, the PMOS transistor 11 turns OFF and the NMOS transistor 13 also turns OFF. However, if those two transistors turn ON, the power supply voltage is applied between the source and the drain of the P-channel non-volatile memory element 15 for writing. In addition, if the voltage of the terminal T5 for controlling the control gate is close to the ground voltage, the P-channel non-volatile memory element 15 for writing turns ON. However, even if a channel is formed in the P-channel non-volatile memory element and a current flows therethrough, drain avalanche hot electrons are less likely to be generated because the drain voltage for reading is not sufficient to generate the drain avalanche hot electrons, and hence erroneous writing is less likely to occur in the P-channel non-volatile memory element. Even if the drain avalanche hot electrons are generated, the potential of the gate is lower than that of the source and the drain, and hence the hot electrons are not directed to the floating gate as the direction of an electric field. This point is a large difference from the case where the transistor for writing is an N-type transistor. In the N-channel non-volatile memory element, even when the drain voltage is not high, hot electrons are generated in the channel. In this case, when the gate voltage is not lower than the drain voltage, the hot electrons are injected into the floating gate.

In other words, in this embodiment, erroneous writing is suppressed at the time of power-on.

Operation after Completion of Reading

In this case, the voltage V1 of the terminal T1 is controlled to High level and the PMOS transistor 11 turns OFF. The voltage V3 of the terminal T3 is controlled to Low level and the NMOS transistor 13 turns OFF. The voltage V2 of the terminal T2 is controlled to High level and the PMOS transistor 12 turns OFF. The voltage V4 of the terminal T4 is controlled to Low level and the NMOS transistor 14 turns OFF.

Even when the power supply voltage is applied to the power supply terminal, no voltage is applied between the source and the drain of the P-channel non-volatile memory element 15. Further, no voltage is applied between the source and the drain of the N-channel non-volatile memory element 16, either. However, after the completion of reading, the above-mentioned drain voltage at High level (reading result of the N-channel non-volatile memory element 16) is still held by the latch 17.

Note that, the connection destination of the latch 17 is the drain of the N-channel non-volatile memory element 16, but an appropriate circuit design may be made so that the connection destination is changed to the source thereof. In addition, an appropriate circuit design may be made so that a resistor is provided to the drain of the PMOS transistor 12 in order to stabilize the signal to be held by the latch 17.

MODIFIED EXAMPLE 1

Figure 4:
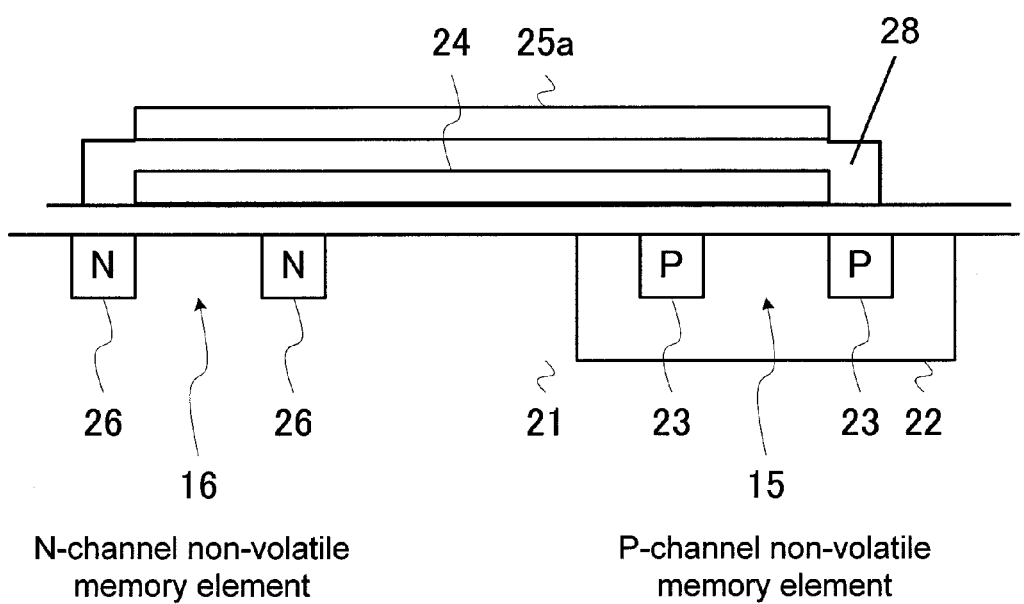
FIG. 4 is a cross-sectional diagram illustrating non-volatile memory elements.

FIG. 2 is compared with FIG. 4. In FIG. 2, the control gate is the N-type diffusion layer 25 provided in the semiconductor substrate 21. However, the control gate may be a polysilicon film 25a as illustrated in FIG. 4. In this case, the polysilicon film 25a corresponding to the control gate is provided above a polysilicon film 24 corresponding to the floating gate through the intermediation of an insulating film 28.

MODIFIED EXAMPLE 2

Figure 5:
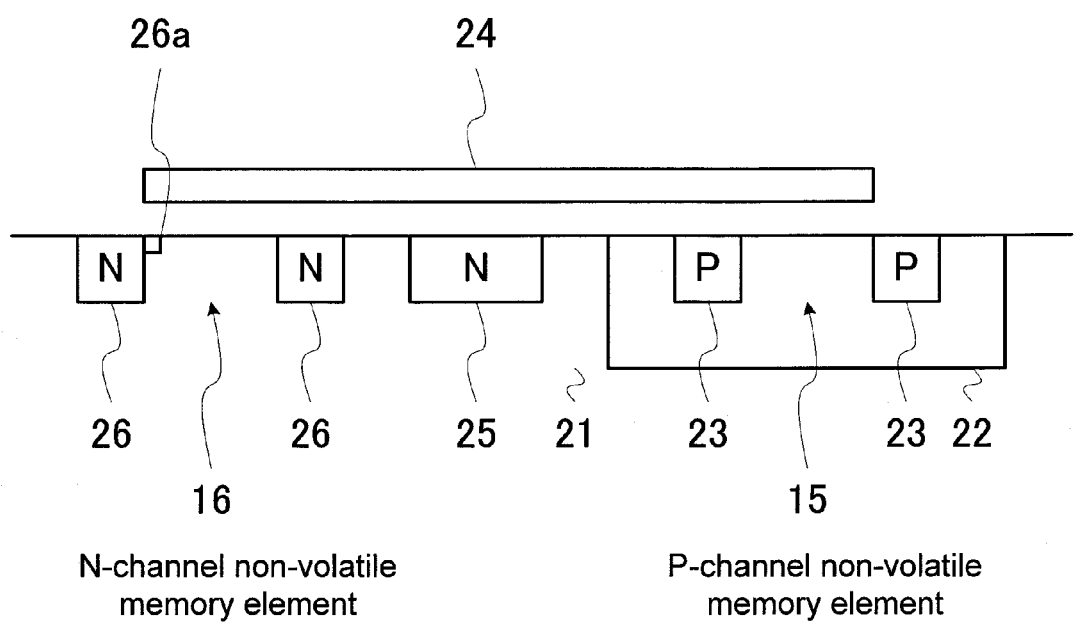
FIG. 5 is a cross-sectional diagram illustrating non-volatile memory elements.

FIG. 2 is compared with FIG. 5. As illustrated in FIG. 5, an N-type diffusion layer 26a having low concentration (denoted by N-) may be added. In this case, the N-type diffusion layer 26a is provided in contact with the N-type diffusion layer 26 corresponding to the drain and in front of the channel. The N-type diffusion layer 26a is provided in the vicinity of the surface of the substrate 21. This alleviates an electric field in the vicinity of the drain region, and erroneous writing becomes still less likely to occur in reading. Note that, the N-type diffusion layer 26a may have a still lower concentration (N--) than the low concentration (N-).

MODIFIED EXAMPLE 3

Figure 6:
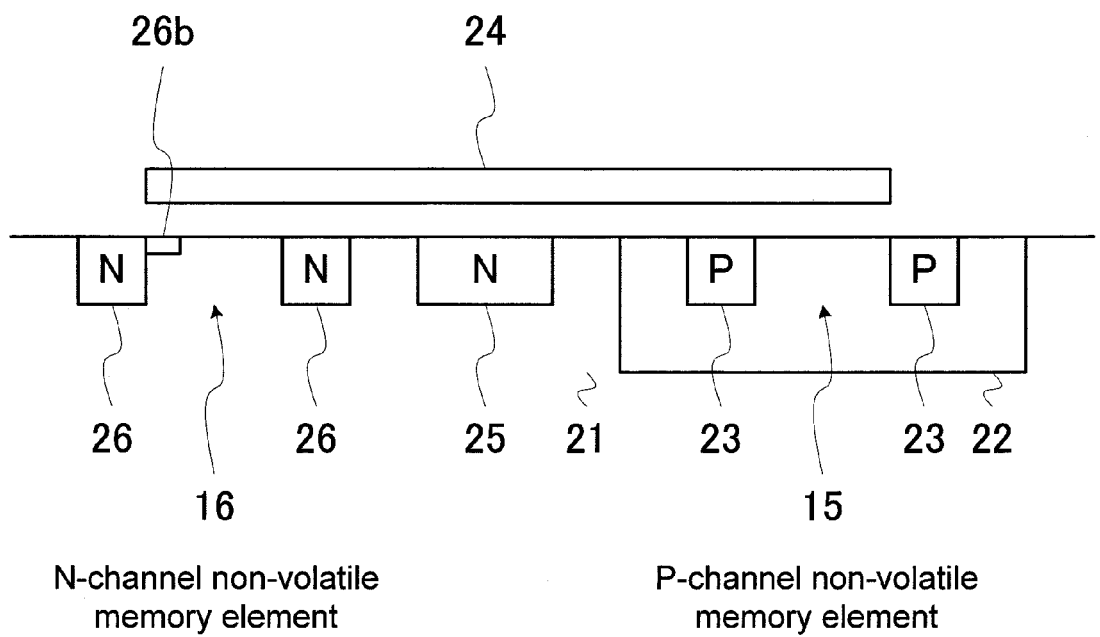
FIG. 6 is a cross-sectional diagram illustrating non-volatile memory elements.

FIG. 5 is compared with FIG. 6. As illustrated in FIG. 6, an N-type diffusion layer 26b may extend toward the channel. In this case, erroneous writing becomes less likely to occur in reading similarly to Modified Example 2.

MODIFIED EXAMPLE 4

Figure 7:
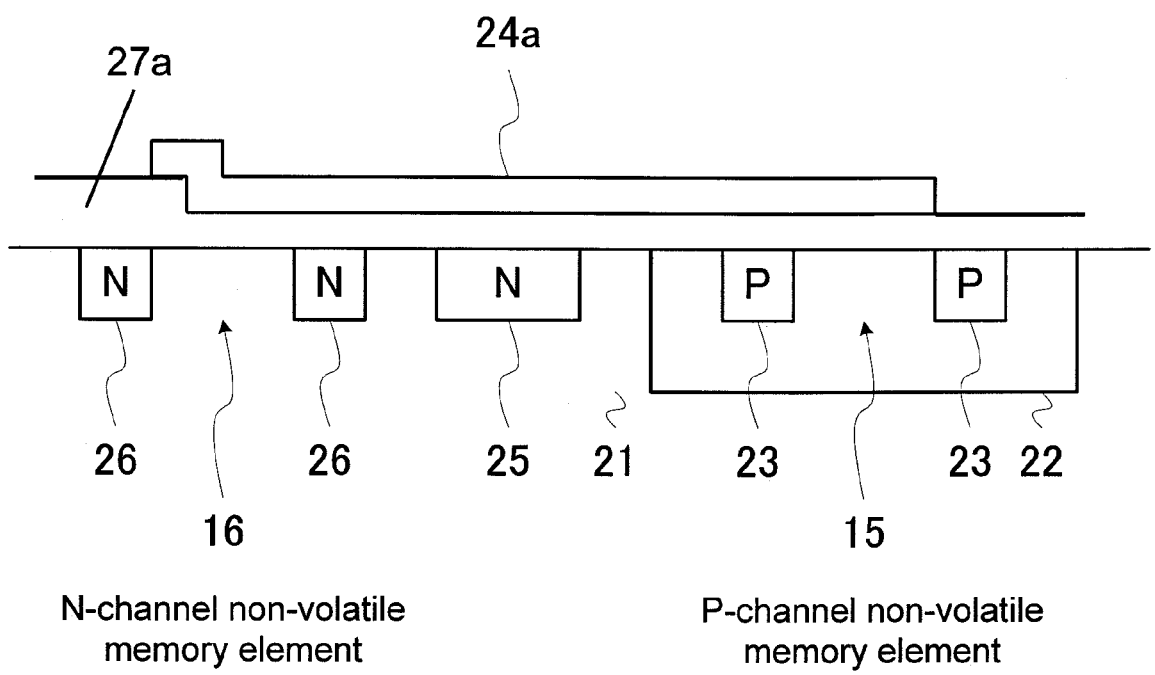
FIG. 7 is a cross-sectional diagram illustrating non-volatile memory elements.

FIG. 2 is compared with FIG. 7. As illustrated in FIG. 7, a thick insulating film 27a may be formed around the region between a polysilicon film 24*a* and the N-type diffusion layer 26 corresponding to a drain. Also in this case, erroneous writing becomes still less likely to occur in reading.

MODIFIED EXAMPLE 5

Figure 8:
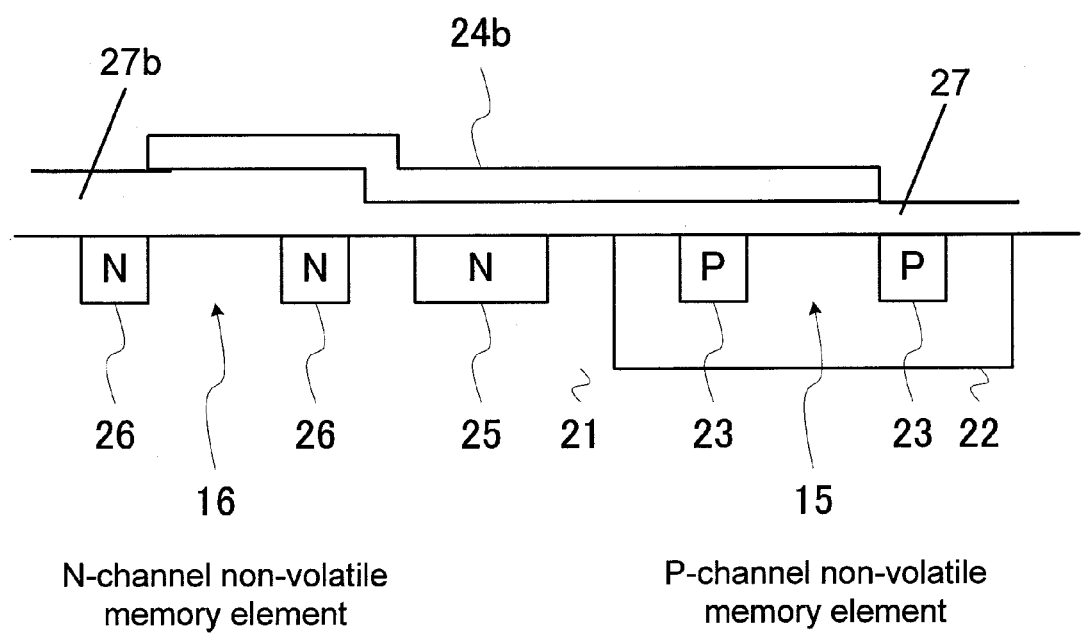
FIG. 8 is a cross-sectional diagram illustrating non-volatile memory elements.
Figure 9:
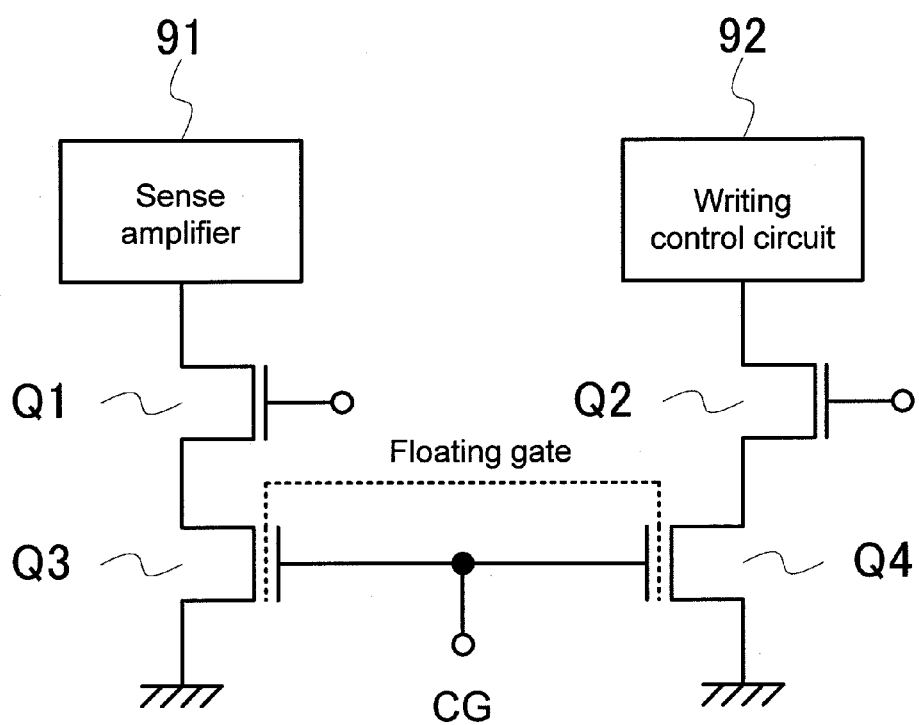
FIG. 9 is a diagram illustrating a conventional memory circuit.

FIG. 2 is compared with FIG. 8. As illustrated in FIG. 8, an insulating film 27*b* (the gate insulating film of the N-channel non-volatile memory element 16) provided under the polysilicon film 24*b* in the region of the N-channel non-volatile memory element 16 may be thicker than the insulating film 27 (the gate insulating film of the P-channel non-volatile memory element 15) provided under the polysilicon film 24*b* in the region of the P-channel non-volatile memory element 15. With this structure, erroneous writing becomes still less likely to occur in reading.

What is claimed is:

1. A memory circuit for writing and reading data with use of a non-volatile memory element, comprising:
   a P-channel non-volatile memory element for writing to which a voltage is applied between a source and a drain thereof only during a writing operation so as to write a data; and
   an N-channel non-volatile memory element for reading having a control gate and a floating gate provided in common to a control gate and a floating gate of the P-channel non-volatile memory element and to which a voltage is applied between a source and a drain thereof only during a reading operation so as to read the data.

2. The memory circuit according to claim 1, further comprising:
   a first switch provided between a power supply terminal and the source of the P-channel non-volatile memory element, and turned ON only during the writing operation; and
   a second switch provided between the power supply terminal and the drain of the N-channel non-volatile memory element, and turned ON only during the reading operation.

3. The memory circuit according to claim 1, further comprising a latch for holding a result of the reading of the N-channel non-volatile memory element after completion of the reading.

4. A memory circuit according to claim 3, wherein:
   the first switch is turned ON during the writing operation, and is turned OFF during the reading operation and after the reading operation is completed; and
   the second switch is turned OFF during the writing operation and after the reading operation is completed, and is turned ON during the reading operation.

5. A memory circuit according to claim 1, wherein the control gate is disposed from a surface to an inside of a semiconductor substrate in which the P-channel non-volatile memory element and the N-channel non-volatile memory element are formed.

6. A memory circuit according to claim 1, wherein the control gate is disposed on an insulating film provided on the floating gate.

7. A memory circuit according to claim 1, further comprising a gate insulating film being thick in a vicinity of the drain of the N-channel non-volatile memory element.

8. A memory circuit according to claim 1, wherein the N-channel non-volatile memory element includes a gate insulating film which is thicker than a gate insulating film of the P-channel non-volatile memory element.

* * * * *